(12) United States Patent
Morimoto et al.

(10) Patent No.: US 6,555,900 B1
(45) Date of Patent: Apr. 29, 2003

(54) PACKAGE, SEMICONDUCTOR DEVICE AND METHOD FOR FABRICATING THE SEMICONDUCTOR DEVICE

(75) Inventors: Shigeru Morimoto, Osaka (JP); Yorito Ota, Hyogo (JP); Masahiro Maeda, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/413,759

(22) Filed: Oct. 6, 1999

(30) Foreign Application Priority Data

Oct. 21, 1998 (JP) .......................................... 10-299402

(51) Int. Cl.⁷ .......................................... H01L 23/495
(52) U.S. Cl. ........................ 257/675; 257/680; 257/690; 257/707; 257/713; 257/724; 361/707; 361/711; 361/718
(58) Field of Search ................................ 257/706, 707, 257/711, 713, 720, 666, 667, 675, 678, 680, 690, 712, 723, 724; 361/704, 707, 709, 711, 718, 719; 438/106, 121, 122, 123, 125, 126; 174/52.2, 52.3, 52.4

(56) References Cited

U.S. PATENT DOCUMENTS

| | | | | |
|---|---|---|---|---|
| 5,477,083 A | * | 12/1995 | Kawai ........................ | 257/701 |
| 5,583,377 A | * | 12/1996 | Higgins, III ................ | 257/707 |
| 5,767,573 A | * | 6/1998 | Noda et al. ................. | 257/675 |
| 5,901,042 A | * | 5/1999 | Ota et al. .................... | 361/704 |

* cited by examiner

Primary Examiner—Albert W. Paladini
Assistant Examiner—Alonzo Chambliss

(57) ABSTRACT

A package according to the present invention includes: a support for mounting a semiconductor component on the upper surface thereof; a positioning control plate, which is secured to the support and includes an opening or a notch; and a lead provided on the support for establishing electrical continuity between the semiconductor component mounted on the support and an external component. The positioning control plate houses at least a lower part of the semiconductor component inside the opening or the notch, thereby controlling a position of the semiconductor component on the support.

3 Claims, 7 Drawing Sheets

US 6,555,900 B1

PACKAGE, SEMICONDUCTOR DEVICE AND METHOD FOR FABRICATING THE SEMICONDUCTOR DEVICE

BACKGROUND OF THE INVENTION

The present invention relates to a package for mounting a semiconductor chip therein and also relates to semiconductor device and method for fabricating the device using the package.

First, conventional package and semiconductor device will be described with reference to FIGS. 7(a) and 7(b).

FIGS. 7(a) and 7(b) illustrate conventional package and semiconductor device formed by mounting a semiconductor chip within the package. Specifically, FIG. 7(a) illustrates a planar layout of the assembly yet to be encapsulated, while FIG. 7(b) illustrates a cross-sectional structure of the assembly taken along the line VIIb—VIIb in FIG. 7(a). As shown in FIGS. 7(a) and 7(b), an outer rail 102 made of an insulator is bonded to a radiating plate 101 made of copper. Input lead 103A and output lead 103B pass through the outer rail 102 and are insulated from the radiating plate 101.

As can be seen, the conventional package is made up of the radiating plate 101, outer rail 102 and input and output leads 103A and 103B.

As shown in FIG. 7(b), semiconductor chips 104, in which semiconductor components are formed as power amplifiers, are bonded to the radiating plate 101 of the package with a foil member 105, which may be an alloy containing tin, inside the outer rail 102.

Circuit boards 106 are also bonded to the radiating plate 101 with the foil member 105 inside the outer rail 102. As shown in FIG. 7(a), some of the circuit boards 106 are located between the semiconductor chips 104 and the input lead 103A, while the other between the semiconductor chips 104 and the output lead 103B. Each of these circuit boards 106 includes a matching circuit, which is formed on an insulating substrate to match the input impedance of the semiconductor components with the output one. The semiconductor chips 104, circuit boards 106 and input and output leads 103A and 103B are connected together via wires 107.

In manufacturing the semiconductor device, the semiconductor device assembled as shown in FIGS. 7(a) and 7(b) is heated within a reflow furnace, thereby melting the foil member 105. Thereafter, the assembly is cooled down to room temperature, thereby bonding the radiating plate 101 to the semiconductor chips 104 and to the circuit boards 106.

The conventional semiconductor device using such a package has the following drawbacks. Specifically, when the foil member 105 of an AuSn alloy is heated and melted by the reflow treatment, the melted foil member 105 expands on the radiating plate 101. As a result, the semiconductor chips 104 and the circuit boards 106 are swept by the melted foil member 105 to be displaced from their desired positions.

SUMMARY OF THE INVENTION

An object of the present invention is preventing semiconductor chips and so on from being displaced from their desired positions on a support of a package when the chips are being bonded to the support.

To achieve this object, according to an exemplary embodiment of the present invention, a positioning control plate for mounting semiconductor chips at their desired positions is provided over a support of a package. In an alternate embodiment of the present invention, positioning control recesses are provided within the upper surface of the support.

A first exemplary package according to the present invention includes: a support for mounting a semiconductor component on the upper surface thereof; a positioning control plate, which is secured to the support and includes an opening or a notch; and a lead provided on the support for establishing electrical continuity between the semiconductor component mounted on the support and an external component. The positioning control plate houses at least a lower part of the semiconductor component inside the opening or the notch, thereby controlling a position of the semiconductor component on the support.

According to the first package, by housing at least the lower part of the semiconductor component inside the opening or the notch during the fabrication process, the semiconductor component can be positioned on the support with respect to the positioning control plate. Thus, even when the bond member, with which the semiconductor component and the support are bonded together, is melted at the time of heat treatment during the fabrication process, it is possible to prevent the semiconductor component from being displaced laterally on the support. As a result, the production yield can be increased noticeably.

In one embodiment of the present invention, the first package preferably further includes an outer rail, which is secured to the support to enclose the positioning control plate therein. The semiconductor component is preferably positioned on the support with respect to the positioning control plate and the outer rail. In such an embodiment, the positioning control plate need not be provided around the periphery of the package. In addition, the semiconductor component can be encapsulated easily and with a lot more certainty within the package only by hermetically covering the entire periphery of the outer rail with a plate member.

In another embodiment of the present invention, the positioning control plate is preferably formed in such a shape as allowing a melted bond member to pass through corners of the opening or the notch while the semiconductor component is being bonded to the support with the bond member. For example, the sidewalls of the opening or the notch may be partially removed to form recesses at the corners. In such a case, the bond member, which is melted at the time of heat treatment during the fabrication process, does not overflow onto the semiconductor component.

In still another embodiment, the first package preferably further includes a platelike control plate bond member, which is provided between the support and the positioning control plate and includes an opening or a notch in substantially the same shape as that of the positioning control plate. In such an embodiment, the positioning control plate can be bonded onto the support if the heat treatment is conducted approximately at the melting point of the control plate bond member.

A second package according to the present invention includes: a support for mounting a semiconductor component on the upper surface thereof; and a lead for establishing electrical continuity between the semiconductor component mounted on the support and an external component. The support includes a recess for housing at least a lower part of the semiconductor component therein, thereby controlling a position of the semiconductor component on the support.

According to the second package, by housing at least the lower part of the semiconductor component inside the recess during the fabrication process, the semiconductor component can be positioned on the support with respect to the positioning control recess. Thus, even when the bond member, with which the semiconductor component and the support are bonded together, is melted at the time of heat treatment during the fabrication process, it is possible to prevent the semiconductor component from being displaced laterally on the support.

A first semiconductor device according to the present invention includes: a support; a positioning control plate, which is secured to the support and includes an opening or a notch; a semiconductor component bonded to the support in such a manner that at least a lower part of the semiconductor component is housed inside the opening or the notch of the positioning control plate; and a lead provided on the support for establishing electrical continuity between the semiconductor component and an external component.

The first semiconductor device is formed by using the first package according to the present invention. Accordingly, the semiconductor component is not displaced from, but can be bonded at, its desired position on the support, thus increasing the production yield.

In one embodiment of the present invention, the first semiconductor device preferably further includes an outer rail, which is secured to the support to enclose the positioning control plate therein. The semiconductor component is preferably positioned on the support with respect to the positioning control plate and the outer rail.

In another embodiment of the present invention, the positioning control plate is preferably formed in such a shape as allowing a melted bond member to pass through corners of the opening or the notch while the semiconductor component is being bonded to the support with the bond member.

In still another embodiment, the first semiconductor device preferably further includes a platelike control plate bond member, which is provided between the support and the positioning control plate and includes an opening or a notch in substantially the same shape as that of the positioning control plate.

In this particular embodiment, the first semiconductor device preferably further includes a foil member, which is provided between the semiconductor component and the support for bonding the semiconductor component to the support. A melting point of the foil member is preferably lower than that of the control plate bond member. In such an embodiment, if the heat treatment is conducted at a temperature, which is equal to or higher than the melting point of the foil member but lower than that of the control plate bond member, to bond the semiconductor component and the support together, then the control plate bond member is not melted. Accordingly, the positioning control plate is not displaced.

A second semiconductor device according to the present invention includes: a support with a recess formed within the upper surface thereof; a semiconductor component bonded to the support in such a manner that at least a lower part of the semiconductor component is housed inside the recess of the support; and a lead provided on the support for establishing electrical continuity between the semiconductor component and an external component.

The second semiconductor device is formed by using the second package according to the present invention. Accordingly, the semiconductor component is not displaced from, but can be bonded at, its desired position on the support, thus increasing the production yield.

A method for fabricating a semiconductor device according to the present invention includes the steps of: a) securing a positioning control plate, including an opening or a notch, to a support; b) placing a foil member, which is used to bond a semiconductor component onto the support, inside the opening or the notch of the positioning control plate on the support; c) mounting the semiconductor component on the foil member inside the opening or the notch of the positioning control plate on the support such that at least a lower part of the semiconductor component is housed within the opening or the notch; and d) heating the support, on which the semiconductor component has been mounted, to melt the foil member and then cooling down and solidifying the foil member melted, thereby bonding the semiconductor component to the support.

According to the method of the present invention, at least the lower part of the semiconductor component is housed inside the opening or the notch of the positioning control plate on the support when the semiconductor component is mounted on the support in the step c). Thus, even when the foil member is melted in the step d), the semiconductor component can be positioned with respect to the positioning control plate. As a result, it is possible to prevent the semiconductor component from being displaced laterally on the support.

In one embodiment of the present invention, the step a) preferably includes: placing a platelike control plate bond member between the support and the positioning control plate, the bond member including an opening or a notch in substantially the same shape as that of the positioning control plate, a melting point of the bond member being higher than that of the foil member; and heating the support on which the positioning control plate is placed to melt the control plate bond member and then cooling down and solidifying the control plate bond member melted, thereby bonding the positioning control plate to the support. In such an embodiment, since the control plate bond member is not melted in the step d), the positioning control plate is not displaced on the radiating plate.

In another embodiment of the present invention, the foil member is preferably made of an alloy containing gold and tin, and the control plate bond member is preferably made of silver solder with a melting point higher than that of the gold/tin alloy.

In still another embodiment, the step d) preferably includes heating the support with a press member placed on the semiconductor component to prevent the semiconductor component from being warped. In such an embodiment, since the semiconductor component is not warped during the heat treatment, the semiconductor component can be bonded onto the support just as originally designed.

BRIEF DESCRIPTION OF THE DRAWINGS

FIG. 1(a) is a plan view of the assembly yet to be encapsulated; and

FIG. 1(b) is a cross-sectional view of the assembly taken along the line Ib—Ib in FIG. 1(a).

FIG. 7(a) is a plan view of the assembly yet to be encapsulated; and

FIG. 7(b) is a cross-sectional view of the assembly taken along the line VIIb—VIIb in FIG. 7(a).

DESCRIPTION OF THE PREFERRED EMBODIMENTS

Embodiment 1

Hereinafter, a first exemplary embodiment of the present invention will be described with reference to the accompanying drawings.

Figure 1A:
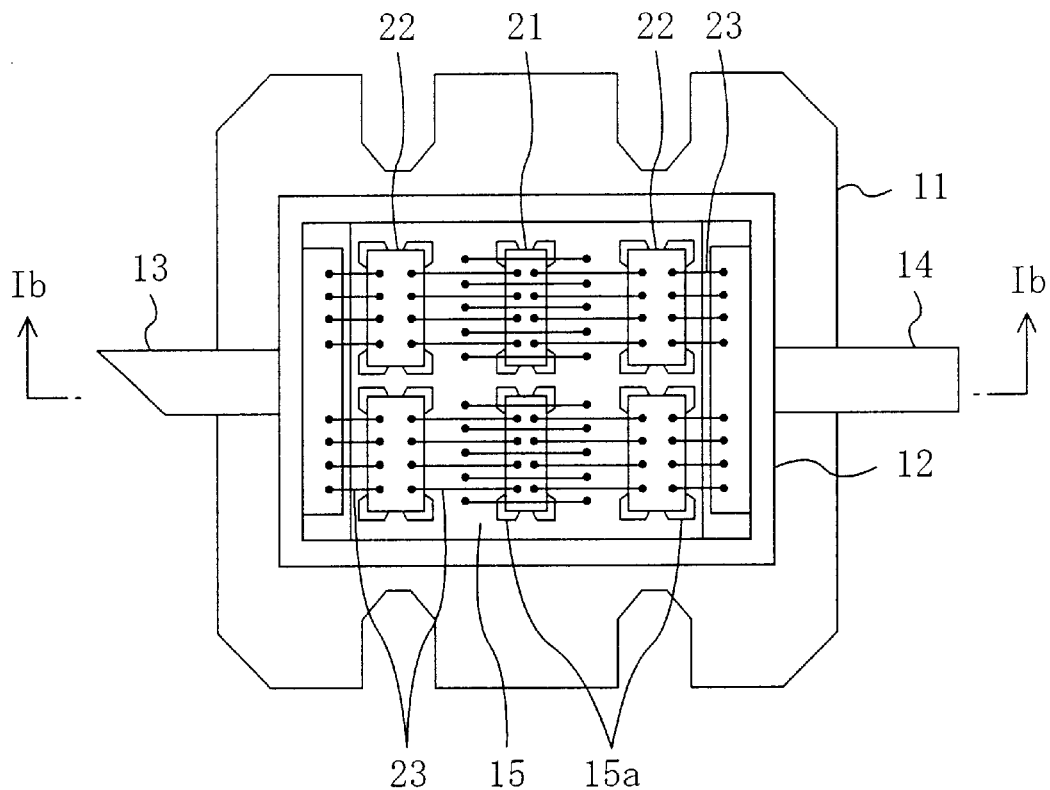
FIGS. 1(a) and 1(b) illustrate package and semiconductor device formed by mounting a semiconductor chip within the package according to a first embodiment of the present invention.
Figure 1B:
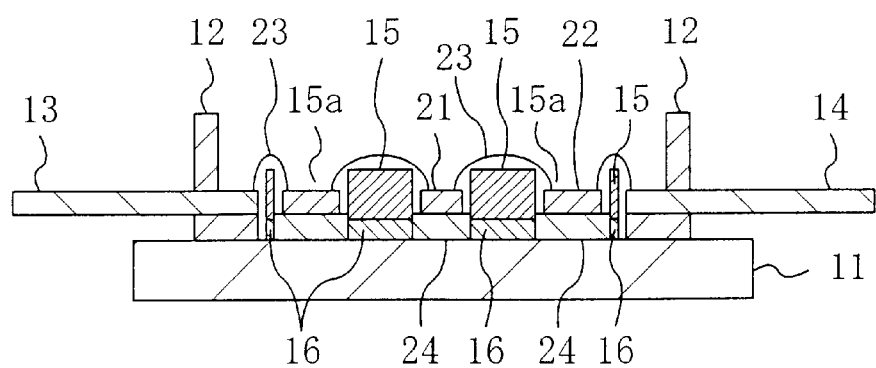

FIGS. 1(a) and 1(b) illustrate package and semiconductor device formed by mounting a semiconductor chip within the package according to the first embodiment. Specifically, FIG. 1(a) illustrates a planar layout of the assembly yet to be encapsulated, while FIG. 1(b) illustrates a cross-sectional structure thereof taken along the line Ib—Ib in FIG. 1(a). As shown in FIG. 1(a), a rectangular outer rail 12 made of an insulator such as a ceramic is bonded to a radiating plate 11 (i.e., the "support" as defined in the appended claims) made of copper, for example. Input lead 13 and output lead 14 pass through a pair of opposed sides of the outer rail 12 and are insulated from the radiating plate 11.

A positioning control plate 15 made of a metal or carbon is bonded to the radiating plate 11 inside the outer rail 12. The positioning control plate 15 has a plurality of openings 15a for positioning semiconductor chips 21 and circuit boards 22 with respect to the inner walls thereof. In the illustrated embodiment, the semiconductor chips 21, circuit boards 22 and input and output leads 13 and 14 are electrically connected to each other via wires 23.

As shown in FIG. 1(b), a silver (Ag) solder plate 16 is provided as the control plate bond member between the radiating plate 11 and the positioning control plate 15. The plate 16 also has a plurality of openings in substantially the same shapes as the openings 15a of the positioning control plate 15. An alloyed foil member 24 made of gold (Au) and tin (Sn) is further provided between the radiating plate 11 and the semiconductor chips 21 and between the radiating plate 11 and the circuit boards 22 to bond the plate 11 and the chips 21 and circuits 22 together.

As can be seen, the package according to the first embodiment is made up of: the radiating plate 11; outer rail 12; input and output leads 13 and 14; positioning control plate 15 with the openings 15a; and silver solder plate 16 with openings in substantially the same shapes as the openings 15a.

In each of these semiconductor chips 21 according to the first embodiment, a power amplifier, which generates heat at a very high temperature during its operation, is formed. Thus, each semiconductor chip 21 has its thickness reduced as much as possible to decrease the thermal resistance thereof and is plated with gold on the backside. Each of the circuit boards 22 includes a plurality of matching circuits formed on a ceramic substrate. These matching circuits each include surface interconnection lines and backside electrodes for distributing or coupling the power to be amplified by the power amplifiers and matching the input impedance of the power amplifiers with the output one.

As shown in FIGS. 1(a) and 1(b), the semiconductor device according to the first embodiment is formed by mounting the semiconductor chips 21 and necessary circuit boards 22 on the alloyed foil member 24 inside the openings 15a of the positioning control plate 15 over the radiating plate 11 such that at least the lower parts thereof are housed inside the openings 15a. In this case, if the positioning control plate 15 is so large that the position thereof is controllable with respect to the outer rail 12, then the silver solder plate 16 does not have to be provided.

Figure 2A:
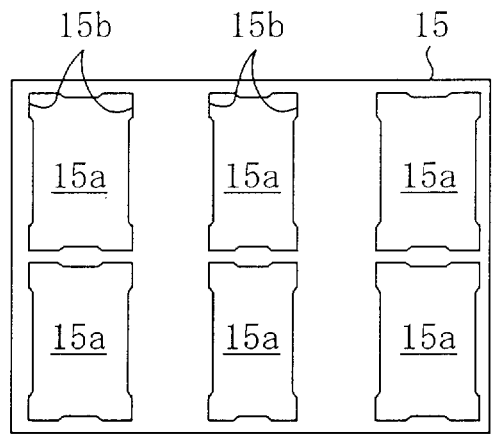
FIG. 2(a) is a plan view illustrating a positioning control plate with openings according to the first embodiment.
Figure 2B:
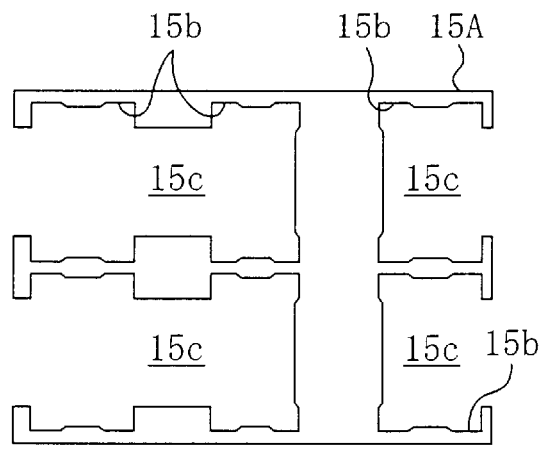
FIG. 2(b) is a plan view illustrating a positioning control plate with notches according to the first embodiment.
Figure 2C:
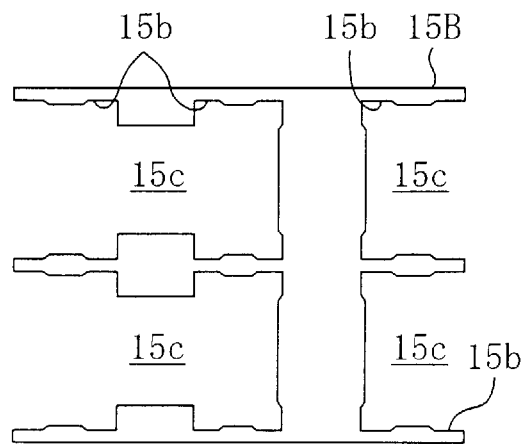
FIG. 2(c) is a plan view illustrating a positioning control plate with notches according to a modified example of the first embodiment.

FIGS. 2(a) through 2(c) illustrate embodiments and a modified example of the positioning control plate. Specifically, FIG. 2(a) illustrates a planar layout of a positioning control plate with openings for positioning the semiconductor chips and so on. FIG. 2(b) illustrates a planar layout of a positioning control plate with positioning control notches. And FIG. 2(c) illustrates a modified example of the positioning control plate shown in FIG. 2(b). The positioning control plate 15 shown in FIG. 2(a) includes a plurality of openings 15a. Each of these openings 15a has recesses 15b formed by partially removing the sidewalls of the positioning control plate 15 at the corners such that the bond member can pass through the recesses 15b while the semiconductor chips are being bonded onto the radiating plate. By providing these recesses 15b, the walls at the corners are closer to the outer periphery of the plate 15 than the other walls are. Accordingly, even when the alloyed foil member 24 as the bond member is melted at the time of heat treatment during the fabrication process of the semiconductor device, the foil member 24 is less likely to overflow onto the upper surfaces of the semiconductor chips 21. In the illustrated embodiment, the recesses 15b are formed at all the corners of each opening 15a. Alternatively, the recesses 15b may be provided only for the corners of openings 15a vertically adjacent to each other.

The positioning control plate 15A shown in FIG. 2(b) includes notches 15c for positioning the semiconductor chips 21 and so on. Each of these notches 15c also has recesses 15b at the corners of its walls.

The positioning control plate 15B shown in FIG. 2(c) according to a modified example is different from the positioning control plate 15A shown in FIG. 2(b) in that the respective ends of the notches 15c have been removed. When a positioning control plate with such a shape is used, the sides of semiconductor chips, facing the open sides of the respective notches 15c, i.e., the leftmost and rightmost sides shown in FIG. 2(c), are positioned with respect to the inner walls of the outer rail 12.

Next, a method for fabricating a semiconductor device with such a structure will be described with reference to the accompanying drawings.

FIGS. 3(a) through 3(c) and FIGS. 4(a) and 4(b) illustrate cross-sectional structures corresponding to respective process steps for fabricating the semiconductor device according to the first embodiment.

Figure 3A:
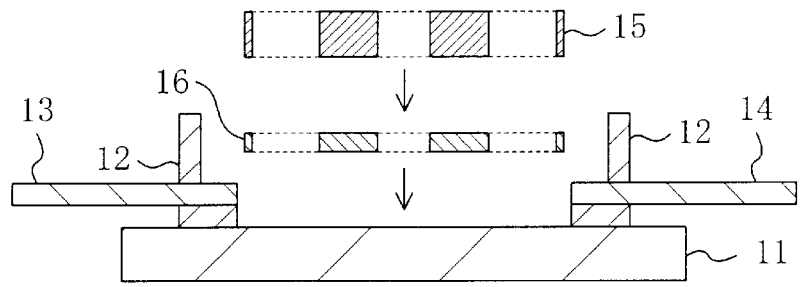
FIGS. 3(a) through 3(c) are cross-sectional views illustrating respective process steps for fabricating a semiconductor device according to the first embodiment.

First, as shown in FIG. 3(a), the outer rail 12, in which the input and output leads 13 and 14 are inserted to face each other, is bonded to the radiating plate 11 such that these leads 13 and 14 are insulated from the radiating plate 11. Next, the silver solder plate 16 and the positioning control plate 15 are placed in this order on a region of the radiating plate 11 inside the outer rail 12. Thereafter, the radiating plate 11, on which the positioning control plate 15 has been placed, is introduced into a reflow furnace and heated up to about 800° C., thereby melting the silver solder plate 16. Then, the radiating plate 11 is cooled down to room temperature again to solidify the silver solder plate 16, thereby bonding the radiating plate 11 and the positioning control plate 15 together. These heating and bonding process steps are collectively called a reflow process. The reflow process for the radiating plate 11 and the outer rail 12 may be performed either simultaneously or separately with/from the reflow process for the radiating plate 11 and the positioning control plate 15.

Figure 3B:
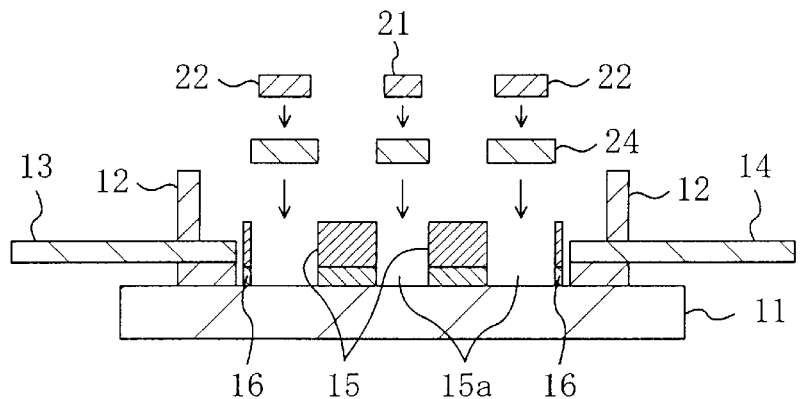

Subsequently, as shown in FIG. 3(b), the alloyed foil member 24 is placed on the radiating plate 11 within the respective openings 15a of the positioning control plate 15, and then the semiconductor chips 21 and circuit boards 22 with a thickness of about 50 μm are mounted on the foil member 24. As can be seen, the semiconductor chips 21 and circuit boards 22 can be mounted according to this embodiment at their desired positions only by placing these members 21 and 22 into the openings 15a of the positioning control plate 15. In other words, positioning can be performed accurately only by forming the openings 15a in predetermined regions of the positioning control plate 15. Accordingly, there is no need to position the semiconductor chips 21 for respective radiating plates 11. In addition, even if the radiating plate 11 vibrates to a certain extent during the assembly, it is still possible to prevent the semiconductor chips 21 and circuit boards 22 on the radiating plate 11 from being displaced during this mounting process step.

Figure 3C:
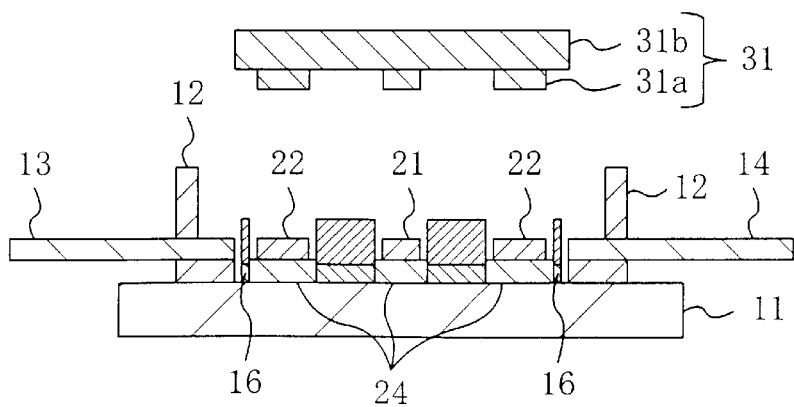

Then, as shown in FIG. 3(c), a press member 31 including protrusions 31a and a body 31b is prepared. The protrusions 31a are formed on the body 31b to come into contact with the respective upper surfaces of the semiconductor chips 21 and circuit boards 22 bonded to the radiating plate 11. Subsequently, the press member 31 is mounted over the radiating plate 11 such that the respective upper surfaces of the protrusions 31a of the press member 31 face the corresponding upper surfaces of the semiconductor chips 21 and circuit boards 22.

By using the press member 31, it is possible to prevent the semiconductor chips 21 from being warped during the reflow process. That is to say, the periphery of the semiconductor chip 21 does not detach itself from the radiating plate 11. In this embodiment, the press member 31 is made of carbon, which is highly resistant to the reflow process.

Figure 4A:
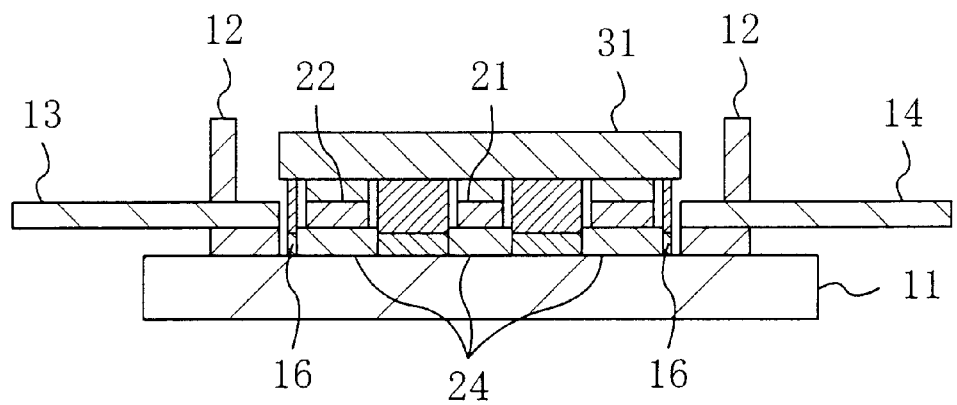
FIGS. 4(a) and 4(b) are cross-sectional views illustrating respective process steps for fabricating the semiconductor device according to the first embodiment.

Next, as shown in FIG. 4(a), the radiating plate 11, on which the press member 31 has been mounted, is introduced into the reflow furnace again and heated up to about 300° C. By performing the reflow process at such a temperature as not melting the silver solder plate 16, only the alloyed foil member 24 can be melted. In addition, the semiconductor chips 21 are not warped, either, since the upper surfaces thereof are pressed tight by the press member 31. Thereafter, the radiating plate 11 is cooled down to room temperature. As a result, the semiconductor chips 21 and circuit boards 22 are bonded to the radiating plate 11 just as designed without causing any displacement.

Figure 4B:
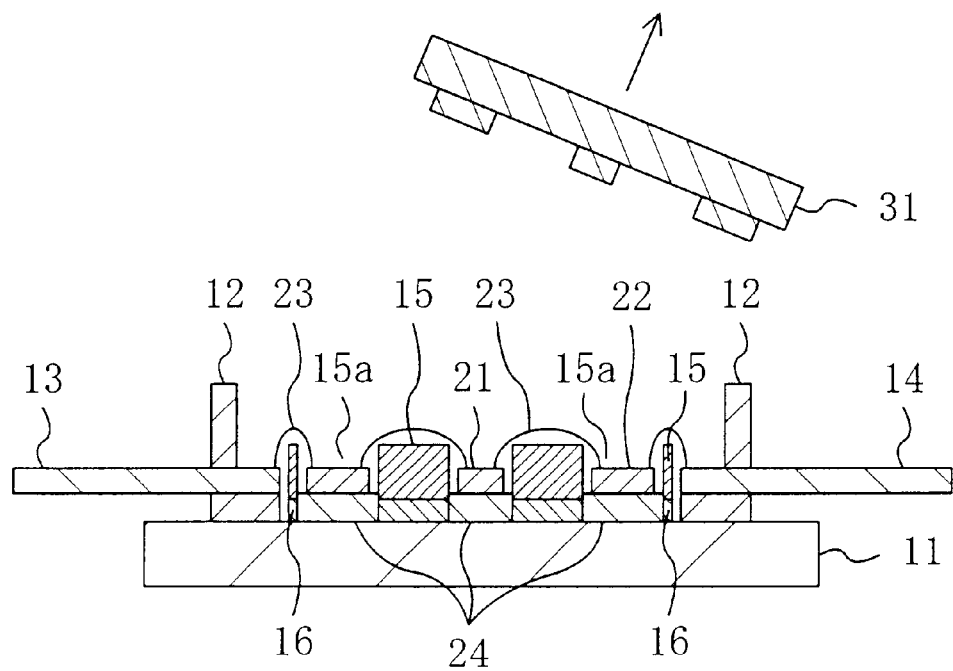

Then, as shown in FIG. 4(b), the press member 31 is removed from the radiating plate 11. Finally, the input and output leads 13 and 14 are electrically connected to the circuit boards 22 via the wires 23 at respective regions inside the outer rail 12 and the semiconductor chips 21 are also connected to the circuit boards 22 via the wires 23. As a result, the semiconductor device shown in FIGS. 1(a) and 1(b) is completed.

As described above, according to the method of the first embodiment, while the reflow process is performed for the semiconductor chips 21 and circuit boards 22, the chips 22 and boards 22 over the radiating plate 11 can be positioned with respect to the positioning control plate 15 with the openings 15a in substantially the same shapes as the backsides of the chips 21 and boards 22. Thus, even when the alloyed foil member 24 is melted, the chips 21 and boards 22 are neither swept nor displaced by the melted foil member 24. As a result, it is possible to prevent the semiconductor chips 21 and circuit boards 22 from being displaced laterally over the radiating plate 11.

In addition, according to this embodiment, the positioning control plate 15 has the recesses 15b at the corners of each opening 15a as shown in FIG. 2(a), for example. Thus, during the reflow process on the semiconductor chips 21, the melted foil member 24 can be stored within the recesses 15b. That is to say, no superfluous foil member 24 melted overflows through the openings 15a onto the upper surfaces of the semiconductor chips 21.

As to the positioning control plate 15 shown in FIG. 4(b), the walls of the openings 15a are higher than the semiconductor chips 21 and circuit boards 22. However, the walls of the openings 15a only need to be high enough to house at least the lower parts of the chips 21 and boards 22 within the openings 15a.

Also, when the positioning control plate 15B shown in FIG. 2(c) is used, there is no need to bond the positioning control plate 15B to the radiating plate 11. In such a case, the positioning control plate 15B may be removed from the radiating plate 11 for future use after the semiconductor device is completed. As a result, effective use of resources and reduction in fabrication cost are both realized.

Embodiment 2

Next, a second exemplary embodiment of the present invention will be described with reference to the accompanying drawings.

Figure 5:
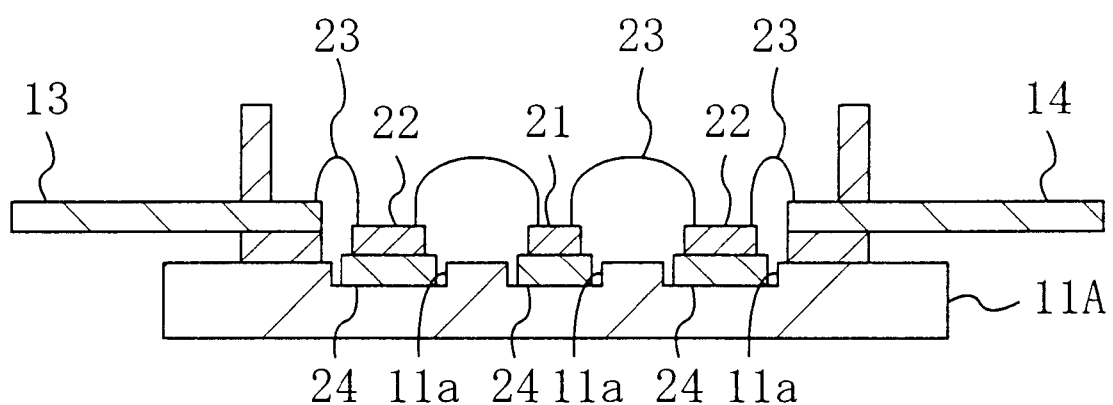
FIG. 5 is a cross-sectional view illustrating package and semiconductor device formed by mounting a semiconductor chip within the package according to a second embodiment of the present invention.

FIG. 5 illustrates a cross-sectional structure of package and semiconductor device formed by mounting a semiconductor chip within the package according to the second embodiment. In FIG. 5, the same members as those illustrated in FIG. 1(b) are identified by the same reference numerals and the description thereof will be omitted herein.

As shown in FIG. 5, the package according to the second embodiment is characterized by including a radiating plate 11A with a plurality of positioning control recesses 11a. By housing at least the lower parts of the semiconductor chips 21 and circuit boards 22 within the recesses 11a of the radiating plate 11A, the chips 21 and boards 22 can be positioned on the radiating plate 11A with respect to the inner walls of the recesses 11a.

In this case, the recesses 11a of the radiating plate 11A may be formed by pressing, for example, to have desired shapes that are substantially the same as the backsides of the semiconductor chips 21 and circuit boards 22.

Hereinafter, a method for fabricating a semiconductor device with such a structure will be described with reference to the accompanying drawings.

Figure 6A:
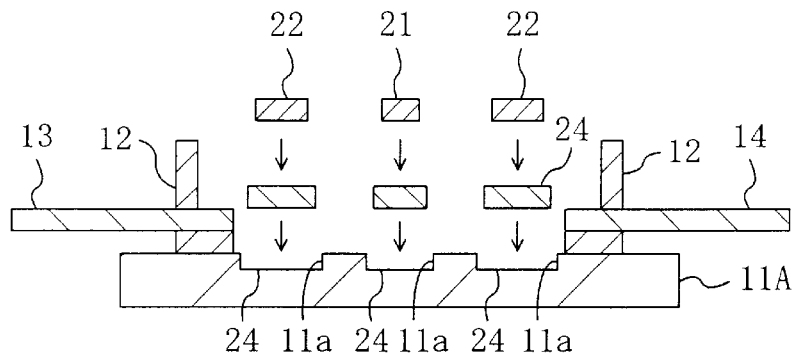
FIGS. 6(a) through 6(c) are cross-sectional views illustrating respective process steps for fabricating a semiconductor device according to the second embodiment.
Figure 6B:
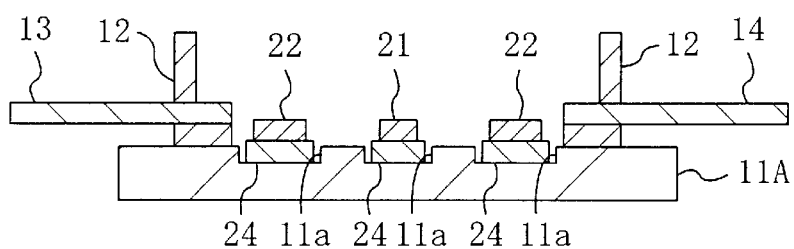
Figure 6C:
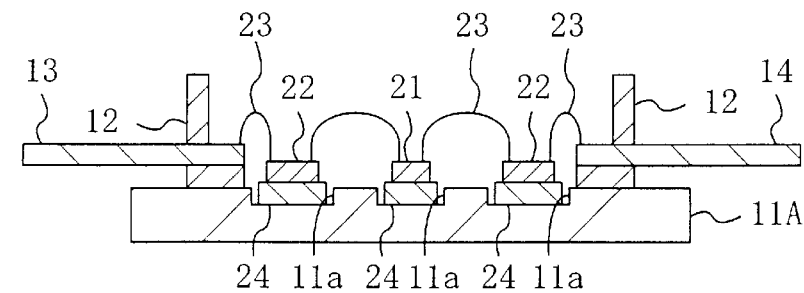
Figure 7A:
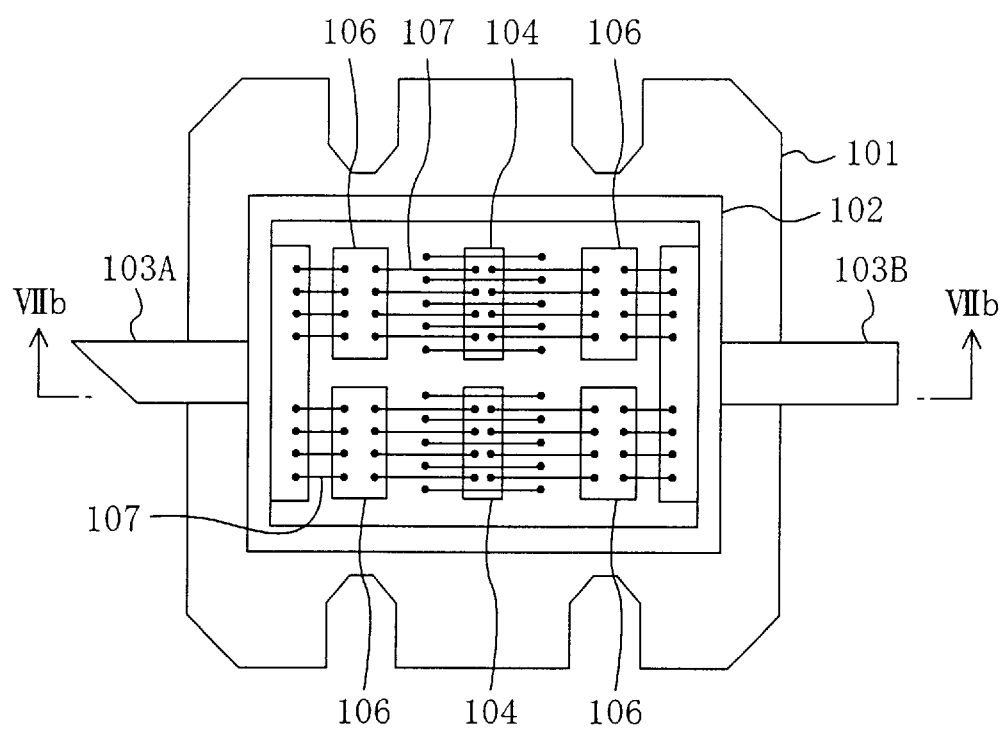
FIGS. 7(a) and 7(b) illustrate conventional package and semiconductor device formed by mounting a semiconductor chip within the package.
Figure 7B:
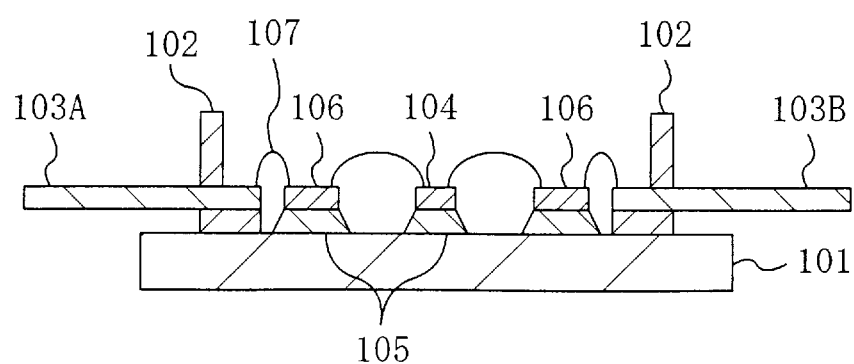

FIGS. 6(a) through 6(c) illustrate cross-sectional structures corresponding to respective process steps for fabricating a semiconductor device according to the second embodiment.

First, as shown in FIG. 6(a), the outer rail 12, in which the input and output leads 13 and 14 are inserted to face each other, is placed on the radiating plate 11A such that these leads 13 and 14 are insulated from the radiating plate 11A. Next, the radiating plate 11A, on which the outer rail 12 has been placed, is introduced into a reflow furnace and heated up to about 800° C., thereby melting the silver solder member (not shown) therebetween. Then, the radiating plate 11A is cooled down to room temperature again to solidify the silver solder member, thereby bonding the radiating plate 11A and the outer rail 12 together. Subsequently, the alloyed foil member 24 is placed within the respective recesses 11a of the radiating plate 11A, and then the semiconductor chips 21 and circuit boards 22 with a thickness of about 50 μm are mounted on the foil member 24.

As can be seen, the semiconductor chips 21 and circuit boards 22 can be mounted according to this embodiment at their desired positions only by placing these members 21 and 22 into the positioning control recesses 11a. In other words, positioning can be performed accurately only by forming the recesses 11a in predetermined regions of the radiating plate 11A. Accordingly, there is no need to position the semiconductor chips 21 for respective radiating plates 11A. In addition, even if the radiating plate 11A vibrates to a certain extent during the assembly, it is still possible to prevent the semiconductor chips 21 and circuit boards 22 on the radiating plate 11A from being displaced laterally during this mounting process step.

Then, as shown in FIG. 6(b), the radiating plate 11A, on which the semiconductor chips 21 have been mounted, is introduced into the reflow furnace again and heated up to about 300° C., thereby melting only the alloyed foil member 24. Thereafter, the radiating plate 11A is cooled down to room temperature again. As a result, the semiconductor chips 21 and circuit boards 22 are bonded to the radiating plate 11A just as designed without causing any displacement. In this case, if the reflow process is performed with the press member 31 placed on the upper surfaces of the semiconductor chips 21 as in the first embodiment, then the semiconductor chips 21 are not warped, thus bonding the chips 21 to the radiating plate 11A more strongly.

Then, as shown in FIG. 6(c), the input and output leads 13 and 14 are electrically connected to the circuit boards 22 via the wires 23 at respective regions inside the outer rail 12 and the semiconductor chips 21 are also connected to the circuit boards 22 via the wires 23. As a result, the semiconductor device shown in FIG. 5 is completed.

As described above, according to the second embodiment, while the reflow process is performed for the semiconductor chips 21 and circuit boards 22, the chips 22 and boards 22 can be positioned over the radiating plate 11A with respect to the recesses 11a of the radiating plate 11A in substantially the same shapes as the backsides of the chips 21 and boards 22. Thus, even when the alloyed foil member 24 is melted, the chips 21 and boards 22 are neither swept nor displaced laterally by the melted foil member 24 over the radiating plate 11A.

What is claimed is:

1. A package comprising:

a support for mounting a semiconductor component on the upper surface thereof;

a positioning control plate, which is provided on the support and includes an opening or a notch that passes through the top to the bottom surfaces of the positioning control plate;

a lead provided on the support for establishing electrical continuity between the semiconductor component mounted on the support and an external component, and a platelike control plate bond member provided between the support and the positioning control plate including an opening or a notch in substantially the same shape as that of the positioning control plate;

wherein the positioning control plate houses at least a lower part of the semiconductor component inside the opening or the notch, thereby controlling a position of the semiconductor component on the support.

2. A semiconductor device comprising:

a support;

a positioning control plate, which is provided on the support and includes an opening or a notch that passes through the top to the bottom surfaces of the positioning control plate;

a semiconductor component bonded to the support in such a manner that at least a lower part of the semiconductor component is housed inside the opening or the notch of the positioning control plate;

a lead provided on the support for establishing electrical continuity between the semiconductor component and an external component; and a platelike control plate bond member provided between the support and the positioning control plate including an opening or a notch in substantially the same shape as that of the positioning control plate.

3. The semiconductor device of claim 2, further comprising a foil member, which is provided between the semiconductor component and the support for bonding the semiconductor component to the support, wherein a melting point of the foil member is lower than that of the control plate bond member.

* * * * *

UNITED STATES PATENT AND TRADEMARK OFFICE
CERTIFICATE OF CORRECTION

PATENT NO. : 6,555,900 B1
DATED : April 29, 2003
INVENTOR(S) : Shigeru Morimoto et al.

It is certified that error appears in the above-identified patent and that said Letters Patent is hereby corrected as shown below:

<u>Title page,</u>
Item [54], Title, delete "PACKAGE, SEMICONDUCTOR DEVICE AND METHOD FOR FABRICATING THE SEMICONDUCTOR DEVICE" insert -- SEMICONDUCTOR PACKAGE UTILIZING A POSITIONING CONTROL PLATE --;
Item [73], Assignee, delete "Kadoma (JP)" and insert -- Osaka (JP) --;

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,555,900 B1 Page 1 of 1
APPLICATION NO. : 09/413759
DATED : April 29, 2003
INVENTOR(S) : Shigeru Morimoto et al.

It is certified that error appears in the above-identified patent and that said Letters Patent is hereby corrected as shown below:

Section [56], "References Cited," insert the following references:

--US 4,985,753  01/2001         US 5,227,663  07/1993

US 5,436,203  07/1995         US 5,455,456  10/1995

US 5,386,342  01/1995         JP 9-293806  11/1997

JP 2-122659  05/1990          JP 8-186189  07/1996

JP 3-16161  01/1991           JP 9-298218  11/1997

JP 2000-77440  03/2000        JP 2001-196521  07/2001

US 6,282,781  09/2001

US 4,814,943  3/1989

US 6,265,762  07/2001--

Signed and Sealed this

Twenty-seventh Day of March, 2007

JON W. DUDAS
*Director of the United States Patent and Trademark Office*